(12) United States Patent
Gaudet

(10) Patent No.: US 6,229,469 B1
(45) Date of Patent: May 8, 2001

(54) ADAPTIVE DIFFERENTIAL ADC ARCHITECTURE

(75) Inventor: Brian C. Gaudet, San Jose, CA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/290,603

(22) Filed: Apr. 13, 1999

(51) Int. Cl.⁷ .................................................. H03M 3/00

(52) U.S. Cl. ........................................... 341/143; 341/155

(58) Field of Search .................................... 341/143, 155, 341/120

(56) References Cited

U.S. PATENT DOCUMENTS

| | | | |
|---|---|---|---|
| 3,882,488 | * 5/1975 | Kosakowski et al. | 340/347 |
| 4,590,458 | * 5/1986 | Evans et al. | 340/347 |
| 4,924,224 | * 5/1990 | Takahashi et al. | 341/155 |
| 6,100,834 | * 8/2000 | Lewyn | 341/155 |

* cited by examiner

*Primary Examiner*—Peguy JeanPierre
(74) *Attorney, Agent, or Firm*—Steve Mendelsohn

(57) ABSTRACT

Differences between samples are optimally quantized in such a way that the maximum possible difference between samples is equal to the full range of an analog-to-digital converter (ADC). The differential analog-to-digital conversion uses fewer bits in an integrated ADC architecture than prior-art solutions for a given level of quantization noise, thereby enabling faster implementations with both lower power consumption and smaller layout area.

16 Claims, 3 Drawing Sheets

ADAPTIVE DIFFERENTIAL ADC ARCHITECTURE

FIELD OF THE INVENTION

This invention is related to electronics and more particularly to an analog-to-digital converter (ADC) architecture for differential signals.

BACKGROUND

The number of bits available for the ADC architecture is limited by speed and power constraints, and currently, for example, for an ADC sampling at 125 MHz, the resolution is limited to 7 bits. The 100-Mbit Ethernet standard calls for at least 7 bits. To illustrate an example of the impact of this limited ADC resolution upon receive channel performance, a 2V peak-to-peak differential signal at a transmitter attenuates to a pulse response of only 185 mV in amplitude (differential) after travelling 150 meters of the 100-Mbit Ethernet cable. Since the ADC architecture must be able to handle a full signal range, which may extend from about 120 mV to the full 2V peak-to-peak with a long sequence of ones, the ADC architecture must allocate available bits to the full range. For example, a 6-bit ADC has only a few bits to quantize a pulse response as small as 120 mV in the above full signal range.

SUMMARY OF THE INVENTION

In order to solve the above and other problems, according to a first aspect of the invention, a method of adaptively converting an analog signal to a digital signal, includes the steps of: generating an analog differential signal based upon a difference between an estimated last sampled signal and a current signal; amplifying the analog differential signal based upon a gain optimized so as to increase the use of a predetermined input range of an analog-to-digital (A/D) converter; converting the amplified analog differential signal to a digital signal in a first number of bits using the A/D converter; and converting the digital signal into an updated estimated last sampled signal according to a second number of bits using a D/A converter, the second number of bits being different from the first number of bits.

According to a second aspect of the invention, a system for adaptively converting an analog signal to a digital signal, includes: a differential signal unit configured to generate an analog differential signal based upon on a difference between an estimated last sampled signal and a current signal; a track-and-hold unit connected to the differential signal unit and configured to track and hold the analog differential signal; an amplifier connected to the track-and-hold unit and configured to amplify the analog differential signal by a gain so as to generate an amplified analog differential signal; a gain optimization unit connected to the amplifier and configured to optimize a gain based upon the analog differential signal, the optimized gain being applied to the analog differential signal so as to increase the use of a predetermined input range; an analog-to-digital converter connected to the amplifier and having the predetermined input range and configured to convert the amplified analog differential signal to a digital signal represented by a first number of bits; an integrator connected to the analog-to-digital converter and configured to integrate the digital signal to generate a current digital signal represented by a second number of bits different from the first number of bits; and a digital-to-analog converter connected to the integrator and configured to convert the current digital signal into an updated estimated last sampled signal according to a second number of bits and based upon the gain.

According to a third aspect of the invention, An integrated circuit having an analog-to-digital converter (ADC) architecture, the ADC architecture includes: a differential signal unit configured to generate an analog differential signal based upon on a difference between an estimated last sampled signal and a current signal; a track-and-hold unit connected to the differential signal unit and configured to track and hold the analog differential signal; an amplifier connected to the track-and-hold unit and configured to amplify the analog differential signal by a gain so as to generate an amplified analog differential signal; an analog-to-digital (A/D) converter connected to the amplifier and having a predetermined input range for converting the amplified analog differential signal to a digital signal represented by a first number of bits; a gain optimization unit connected to the amplifier and configured to optimize the gain based upon the amplified analog differential signal so as to increase the use of the predetermined input range of the A/D converter; an integrator connected to the A/D converter for integrating the digital signal to generate a current digital signal represented by a second number of bits different from the first number of bits; and a digital-to-analog (D/A) converter connected to the integrator for converting the current digital signal into an updated estimated last sampled signal according to a second number of bits and based upon the gain.

DETAILED DESCRIPTION OF PREFERRED EMBODIMENTS

Figure 1:
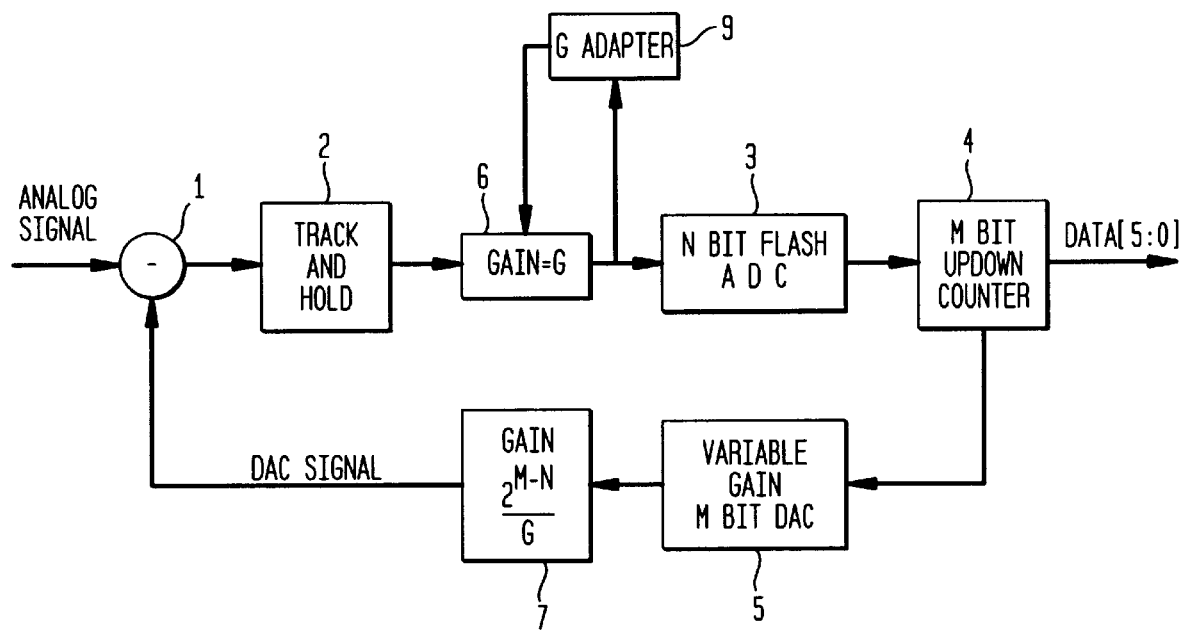
FIG. 1 is a block diagram illustrating a preferred embodiment for adjustably quantizing a differential value according to the current invention.

Referring to FIG. 1, a block diagram illustrates a preferred embodiment of the adaptive differential ADC architecture according to the current invention. A unit 1 subtracts an estimation of the last sampled signal value (a dac signal) from an incoming input analog signal. This difference is sampled by a track-and-hold unit 2 and is then adaptively amplified with a gain G in an amplifier 6 before being sent to an N-bit flash ADC 3. The N-bit flash ADC 3 has a predetermined input range and converts the differential analog signal to an N-bit digital signal upon receiving a clock signal. The conversion is also a quantization process since the analog signal value is approximated by an N-bit digital value. In order to optimize the resolution of the quantization process, a gain adapter 9 adjusts the gain value G based upon each differential analog signal. The quantized difference between the current input signal and the estimated value of the last input signal generated by ADC 3 is a signal designated by diff[N-1:0]. This N-bit digital signal is added or subtracted from an M-bit counter value by an up-down counter 4, which functions as a digital integrator. The diff[N-1:0] signal is added if the difference is positive, while it is subtracted if the difference is negative. The diff[N-1:0]

signal and the current state of the integrator 4 are summed, and the result is used to control an M-bit digital-to-analog converter (DAC) 5, whose output is an input to an attenuator 7. The attenuator 7 uses a gain which is $2^{(m-N)}/G$. The output of the attenuator 7 is the estimation of the last sampled input signal (dac signal).

Still referring to FIG. 1, the value of G determines a value that each bit represents in the ADC 3. For example, a preferred embodiment according to the current invention includes a 6-bit DAC 5 and a 4-bit ADC 3. For the 4-bit ADC 3 having a predetermined 1V peak-to-peak input range, the least significant bit (LSB) represents 62.5 mV (1V/16). A range factor is defined to be $\log_2$ (input signal range/max Δ between samples of the input signal). In other words, the range factor is also defined as $2^{(M-N)}$. Thus, the range factor for the above example is 4 since 6 bits−4 bits=2 bits, and $2^2$=4. Consequently, since the LSB of the 6-bit DAC 5 equals (the LSB value of the 4-bit ADC 3/the range factor), the DAC LSB represents a value of 15.625 mV (62.5 mV/4 ). Now, assuming an input signal ranging from 250 mV to 1V in peak-to-peak difference between samples and further assuming that G is equal to one, the full signal range of 1V is represented by four binary numbers 1111. To correctly recreate the output signal using the DAC, a gain of attenuator 7 of $2^{(M-N)}/G=2^2/1=4$ is needed so that a DAC output value having four binary numbers 1111 will generate an output estimated signal of 1V. For another example, if the maximum possible voltage difference between samples is 250 mV, then G is adjustably increased to 4 to take full advantage of the 1V input range of the ADC 3, and the ADC resolution is increased by a factor of 4, or to 15.625 mV/bit. Now the full signal range of 250 mV is represented by four bits of 1111, and to correctly output the last sample, the gain of the attenuator 7 is 4/G =4/4=1. Thus, as described above, the range factor is used in determining the least significant bit of the DAC and the ADC to represent a correct value.

Figure 2:
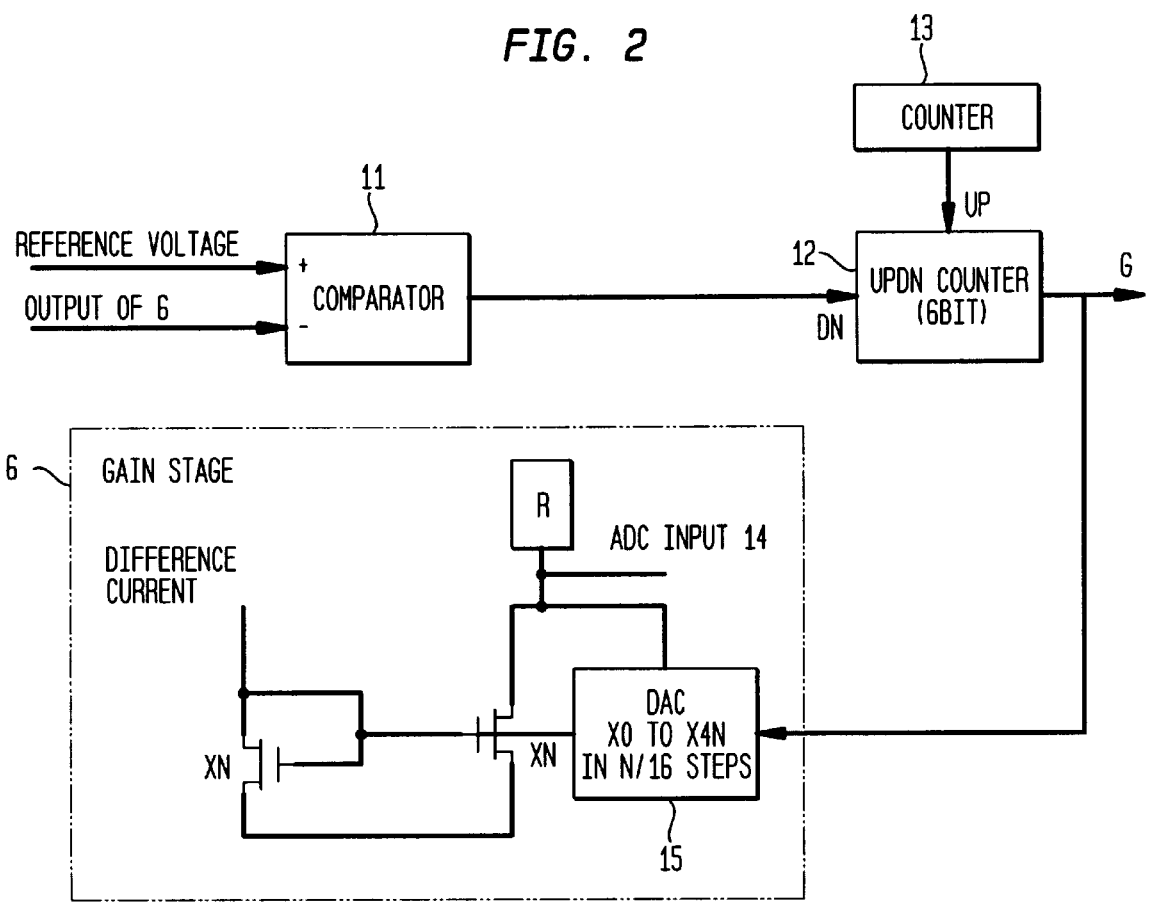
FIG. 2 is a block circuit diagram illustrating a relevant portion of a preferred embodiment for determining a gain value G according to the current invention.

Referring to FIG. 2, a block circuit diagram illustrates one implementation of the gain adapter 9 as well as the gain stage 6 of the preferred embodiment as shown in FIG. 1 according to the current invention. The preferred embodiment initiates its operation at a max gain, and a comparator 11 compares the output of the gain stage 6 to a predetermined reference voltage that is equal to the full input range of the flash ADC 3 as shown in FIG. 1. A counter 13 initializes a max gain value G in a 6-bit up-down counter 12. A slope overload is defined to occur when the difference between samples is greater than an input range of the ADC. If slope overload occurs or the comparator 11 detects that the output of the gain stage 6 is above the predetermined input range of the ADC 3, the gain value G is decreased by decrementing the up-down counter 12. The up-down counter 12 is used to control the gain value G applied to the difference signal before the next ADC input signal 14 from the track-and-hold unit 2 is input to the amplifier 6. Using the same example, the gain G is programmable and is varied from 1 to 4 in a predetermined fixed increment. The output gain is defined by 4/G and is applied to the output signal from the DAC 15. The above-described feature may be implemented by simple current mirrors with a DAC 15 used in place of a non-diode-connected transistor. Counter 13 is used to occasionally increase the gain to compensate for spurious comparisons.

Figure 3A:
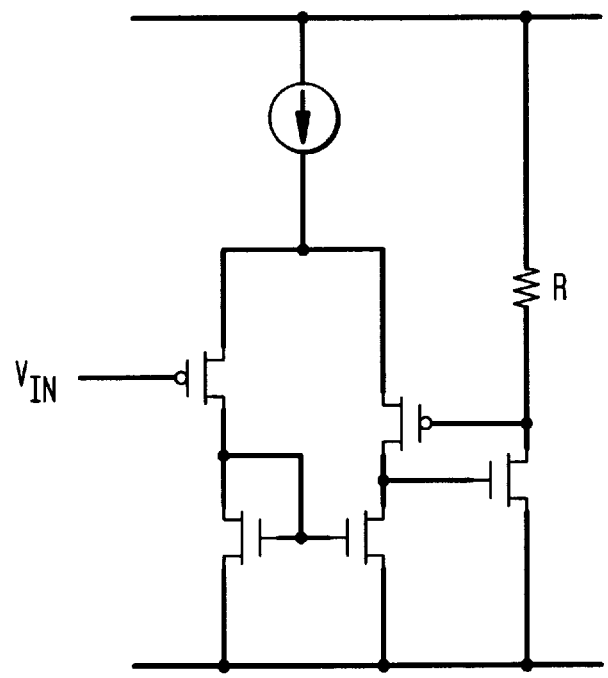
FIGS. 3A and 3B are circuit diagrams respectively illustrating positive and negative voltage-to-current converters which may be used in conjunction with a preferred embodiment of the current invention.
Figure 3B:
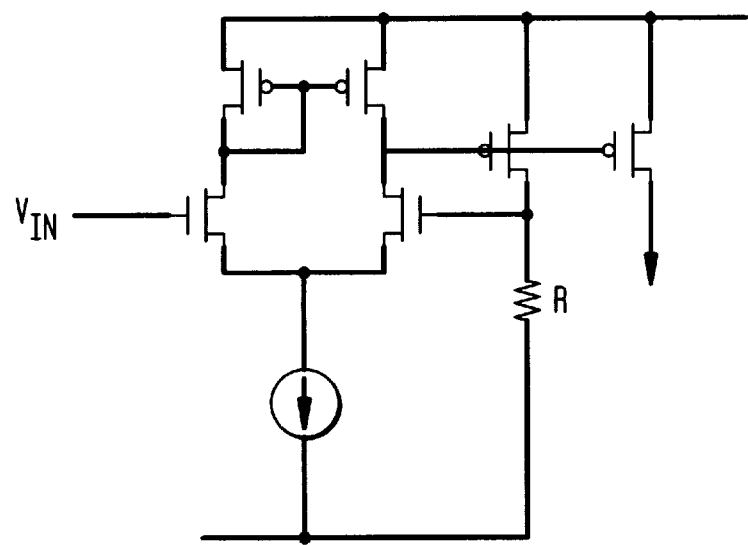

Referring to FIGS. 3A and 3B, a set of voltage-to-current converters is illustrated in circuit diagrams. The current output of these voltage-to-current converters may be used as a front end for alternative embodiments of the adaptive differential ADC architecture according to the current invention. In other words, instead of a voltage differential signal, a current differential signal is used. FIG. 3A illustrates a circuit diagram of a positive voltage-to-current converter, while FIG. 3B illustrates that of a negative voltage-to-current converter.

The following advantageous features are summarized for the current invention. Sampling rate is generally increased due to the differential signal processing, and quantization error is consequently reduced. Since sampling rate is increased, the maximum possible change between samples is also reduced, and the gain is increased. Fewer bits are used in the above-described ADC architecture data path than prior-art ADC architectures without incurring performance penalty. Thus, the above-described preferred embodiments according to the current invention improve in the use of area and power and provides a competitive edge over conventional solutions. For example, if a cable plant was such that channel noise required at least a 10-bit ADC to properly restore signal, and the baud rate was 125 MHz, no commercially available ADC architecture would be capable of handling the above situation. However, if signal attenuation was such that a ratio between the transmitted pulse response and received pulse response was a factor of 8, then the current approach could use a 7-bit ADC to save power and area in data path.

Figure 4:
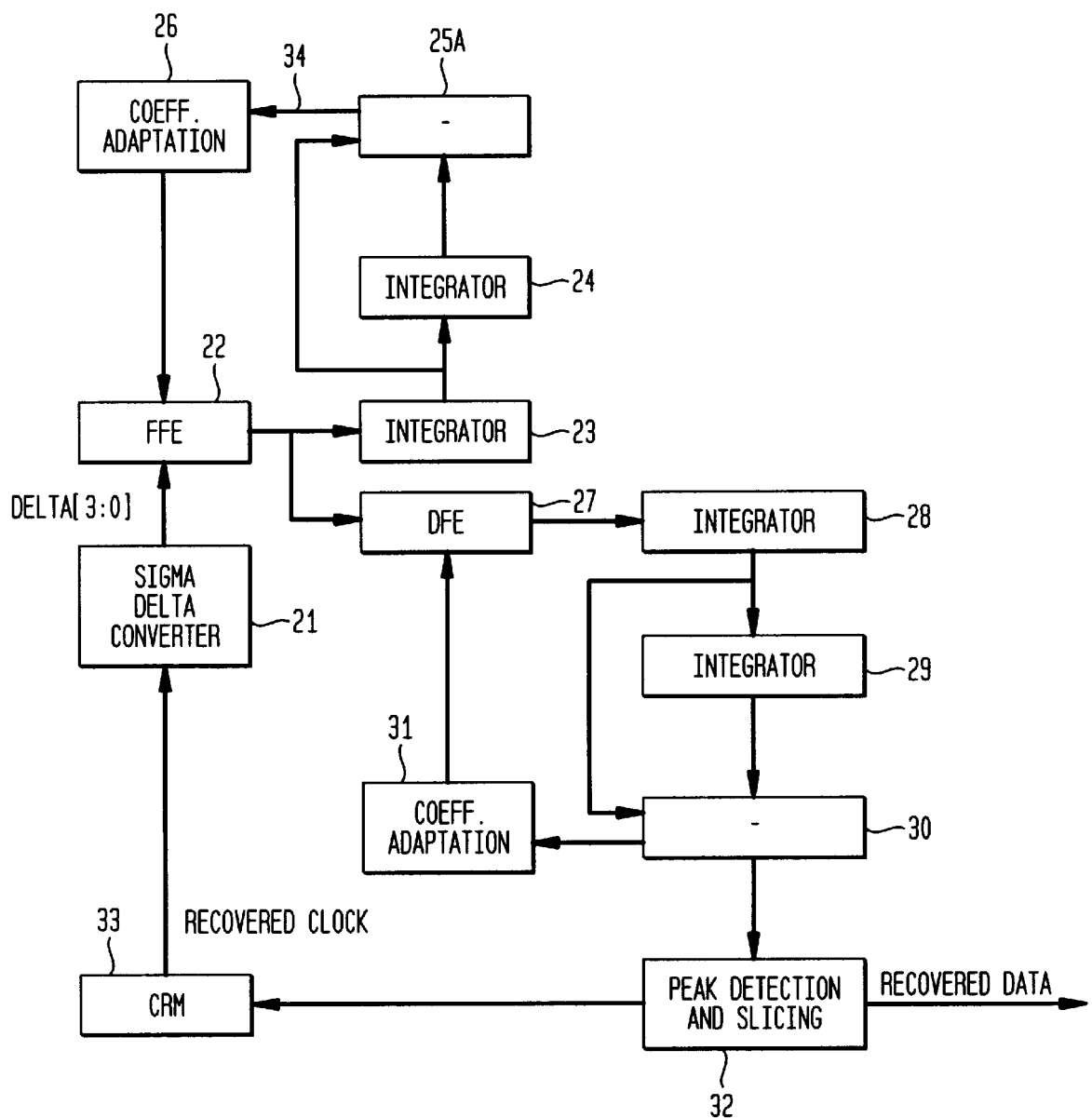
FIG. 4 is a circuit block diagram illustrating a preferred embodiment of a digital signal processor for a differential signal according to the current invention.

Referring to FIG. 4, a circuit block diagram illustrates the core of a differential digital signal processor according to one embodiment of the current invention. For example, one implementation of the preferred embodiment includes a 100-Mbit Ethernet DSP receive function. An input differential signal is generally an amplitude difference between two samples and is 4-bit data which is also designated as delta[3:0]. One way to generate the input differential digital signal is to use a sigma delta converter 21. Another way to generate the input differential signal is to use an adaptive differential ADC architecture as described with respect to FIG. 1.

A sigma delta converter 21 outputs an input differential signal to a first processing unit 22 such as a feed forward equalizer (FFE) 22. The FFE substantially eliminates pre-cursor inter-symbol interference (ISI). A first integrator 23 integrates an output signal of the FFE 22 using a predetermined number of bits for a counter. For example, a 5-bit counter is used because of an unknown initial condition. The output of the first integrator 23 is inputted to a second or smaller integrator 24 such as a 4-bit counter. The second integrator 24 determines an average DC level of the input signal, and a subtraction unit 25 subtracts the average value from the output signal value from the first integrator 23 so as to generate a recovered signal 34. Based upon the recovered signal, a coefficient adaptation unit 26 determines the FFE coefficients. A similar loop is used for a second processing unit such as a decision feedback equalizer (DFE) 27. A second set of units includes a first integrator 28, a second integrator 29, a subtraction unit 30, and a coefficient adaptation unit 31. The second set of the units substantially eliminates post-cursor ISI and determines the DFE coefficients.

Still referring to FIG. 4, the second integrators 24 and 29 are provided due to the differential information or the lack of an initial condition. For example, if the initial condition was −1V, and the integrator started at 0V, then when the signal got to 1V, the integrator would be at 2V. However, the integrator average would be 1V, which is subtracted out to create the correct DC average of 0V. For this reason, the second integrators are provided. A peak detection and slicing unit 32 slices the processed signal into a predetermined range and detects a threshold so as to generate recovered data. A clock recover module 33 recovers the clock pulse and sends a signal to the signal delta converter 21.

Significant savings in area and power are realized by feeding the signal differential between samples, rather than the full signal, through a DSP core such as is shown in FIG. 4. For example, rather than using a 6-bit reconstructed signal as an input to the DSP core, a 4-bit output signal of an ADC such as ADC 3 in FIG. 1 is used. In contrast to the prior art 6-bit wide data, a preferred embodiment according to the current invention utilizing 4-bit data desirably reduces the area as well as power consumption in multipliers and adders in the FFE 22 and the subtractors in the DFE 27. The output is then integrated after all processing is completed, and a DC offset is removed by a second integrator and a subtractor.

As noted above, the digital processing according to the current invention is not limited to the ISI elimination process. Any linear DSP algorithm may be used provided that the following relation holds:

$$sX(s)*H(s)=1/s*Y(s)$$

where X(s) is a LaPlace transform of a time-domain representation of an input signal; H(s) is a transfer function in a frequency domain; 1/s is an integration; and Y(s) is a LaPlace transform of a time-domain representation of an output signal. An integrator is used at any point where adaptation based on an input signal is used.

As a result of the above-described efficient processing, the following advantageous features are obtained: Fewer bits are used in the ADC and DSP data path than a prior-art ADC and DSP approach without incurring any substantial performance penalty. In other words, the current invention saves memory area and power. The current invention enables the use of the DSP solutions at higher data rates than the prior art.

Although the present invention is preferably implemented as part of an integrated circuit, other non-integrated implementations are also possible.

What is claimed is:

1. A method of adaptively converting an analog signal to a digital signal, comprising the steps of:
    a) generating an analog differential signal based upon a difference between an estimated last sampled signal and a current signal;
    b) amplifying said analog differential signal based upon a first gain optimized so as to increase the use of a predetermined input range of an analog-to-digital (A/D) converter;
    c) converting said amplified analog differential signal to a digital signal in a first number of bits using the A/D converter; and
    d) integrating the digital signal to generate an integrated digital signal represented by a second number of bits different from the first number of bits;
    e) converting said integrated digital signal into a second analog signal according to the second number of bits using a digital-to-analog (D/A) converter and
    f) amplifying the second analog signal based upon a second gain to update the estimated last sampled signal, wherein the second gain is a function of the first gain and the first and second numbers of bits.

2. The method of claim 1, wherein a range factor is determined based upon a difference between said first number and said second number so that a least significant bit of said D/A converter and said A/D converter each represent a correct value.

3. The method of claim 1, wherein said first gain is adjusted in a predetermined fixed increment.

4. The method of claim 1, wherein said differential analog signal is a voltage signal.

5. The method of claim 1, wherein said differential analog signal is a current signal.

6. The method of claim 1, wherein the second gain is proportional to:

$$2^{M-N}/G,$$

where:
    N is the first number of bits;
    M is the second number of bits; and
    G is the first gain.

7. A system for adaptively converting an analog signal to a digital signal, comprising:
    a differential signal unit configured to generate an analog differential signal based upon on a difference between an estimated last sampled signal and a current signal;
    a track-and-hold unit connected to said differential signal unit and configured to track and hold said analog differential signal;
    a first amplifier connected to said track-and-hold unit and configured to amplify said analog differential signal by a first gain so as to generate an amplified analog differential signal;
    an analog-to-digital (A/D) converter connected to said first amplifier, having a predetermined input range, and configured to convert said amplified analog differential signal to a digital signal represented by a first number of bits;
    a gain optimization unit connected to said first amplifier and configured to optimize the first gain based upon said amplified analog differential signal so as to increase the use of the predetermined input range of said A/D converter;
    an integrator connected to said A/D converter and configured to integrate said digital signal to generate an integrated digital signal represented by a second number of bits different from the first number of bits;
    a digital-to-analog (D/A) converter connected to said integrator and configured to convert said integrated digital signal into a second analog signal according to the second number of bits; and
    a second amplifier connected to the D/A converter and configured to amplify the second analog signal based upon a second gain to update the estimated last sampled signal, wherein the second gain is a function of the first gain and the first and second numbers of bits.

8. The system of claim 7, wherein said gain optimization unit determines a range factor based upon a difference between said first number of said bits and said second number of said bits so that at least significant bit of said A/D converter and said D/A converter each represent a correct value.

9. The system of claim 7, wherein said differential analog signal is a voltage signal.

10. The system of claim 7, wherein said differential analog signal is a current signal.

11. The system of claim 7, wherein the second gain is proportional to:

$$2^{M-N}/G,$$

where:
    N is the first number of bits;
    M is the second number of bits; and
    G is the first gain.

12. An integrated circuit having an analog-to-digital converter (ADC) architecture, the ADC architecture comprising:
a differential signal unit configured to generate an analog differential signal based upon on a difference between an estimated last sampled signal and a current signal;
a track-and-hold unit connected to said differential signal unit and configured to track and hold said analog differential signal;
a first amplifier connected to said track-and-hold unit and configured to amplify said analog differential signal by a first gain so as to generate an amplified analog differential signal;
an analog-to-digital (A/D) converter connected to said first amplifier, having a predetermined input range, and configured to convert said amplified analog differential signal to a digital signal represented by a first number of bits;
a gain optimization unit connected to said first amplifier and configured to optimize the first gain based upon said amplified analog differential signal so as to increase the use of the predetermined input range of said A/D converter;
an integrator connected to said A/D converter and configured to integrate said digital signal to generate an integrated digital signal represented by a second number of bits different from the first number of bits;
a digital-to-analog (D/A) converter connected to said integrator and configured to convert said integrated digital signal into a second analog signal according to the second number of bits; and
a second amplifier connected to the D/A converter and configured to amplify the second analog signal based upon a second gain to update the estimated last sampled signal; wherein the second gain is a finction of the first gain and the first and second numbers of bits.

13. The integrated circuit of claim 12, wherein said gain optimization unit determines a range factor based upon a difference between said first number of said bits and said second number of said bits so that at least significant bit of said A/D converter and said D/A converter each represent a correct value.

14. The integrated circuit of claim 12, wherein said differential analog signal is a voltage signal.

15. The integrated circuit of claim 12, wherein said differential analog signal is a current signal.

16. The integrated circuit of claim 12, wherein the second gain is proportional to:

$$2^{M-N}/G,$$

where:

N is the first number of bits;

M is the second number of bits; and

G is the first gain.

* * * * *